(12) United States Patent
Han et al.

(10) Patent No.: US 12,215,927 B2
(45) Date of Patent: Feb. 4, 2025

(54) EVAPORATION DEVICE FOR COOLING

(71) Applicant: HYOSUNG HEAVY INDUSTRIES CORPORATION, Seoul (KR)

(72) Inventors: Chang Woo Han, Goyang-si (KR); Seung Boong Jeong, Anyang-si (KR); Joon Hong Boo, Goyang-si (KR)

(73) Assignee: HYOSUNG HEAVY INDUSTRIES CORPORATION, Seoul (KR)

( * ) Notice: Subject to any disclaimer, the term of this patent is extended or adjusted under 35 U.S.C. 154(b) by 238 days.

(21) Appl. No.: 17/909,918

(22) PCT Filed: Jan. 28, 2021

(86) PCT No.: PCT/KR2021/001165
§ 371 (c)(1),
(2) Date: Sep. 7, 2022

(87) PCT Pub. No.: WO2021/182751
PCT Pub. Date: Sep. 16, 2021

(65) Prior Publication Data
US 2023/0104454 A1 Apr. 6, 2023

(30) Foreign Application Priority Data
Mar. 9, 2020 (KR) .................. 10-2020-0029179

(51) Int. Cl.
*F28D 15/00* (2006.01)
*F28D 15/04* (2006.01)
*F28D 15/02* (2006.01)

(52) U.S. Cl.
CPC .......... *F28D 15/04* (2013.01); *F28D 15/0266* (2013.01)

(58) Field of Classification Search
CPC .............................. F28D 15/04; F28D 15/0266
USPC ....................................................... 165/104.26
See application file for complete search history.

(56) References Cited

U.S. PATENT DOCUMENTS

| 2007/0284088 A1 | 12/2007 | Chun |
| 2013/0160976 A1 | 6/2013 | Wu et al. |
| 2013/0223010 A1 | 8/2013 | Shioga et al. |
| 2013/0312939 A1 | 11/2013 | Uchida et al. |

FOREIGN PATENT DOCUMENTS

| JP | 2010133579 A | * | 6/2010 | ......... F28D 15/0266 |
| JP | 5136376 B2 | * | 2/2013 | ......... F28D 15/0266 |
| JP | WO2012046338 A1 | | 2/2014 | |
| KR | 20060049770 A | | 5/2006 | |
| KR | 20120015832 A | | 2/2012 | |
| KR | 20190081999 A | | 7/2019 | |

* cited by examiner

*Primary Examiner* — Davis D Hwu
(74) *Attorney, Agent, or Firm* — NKL Law; Jae Youn Kim

(57) ABSTRACT

The present disclosure is an evaporation device for cooling. In an evaporation space 12 formed inside a housing 10, a wick 16 allows a working fluid to move by capillary force. As the working fluid moves from a lower portion of the evaporation space 12 to an upper portion thereof, that is, from the working fluid inlet pipe 26 to the vapor outlet pipe 28 by the wick 16, the working fluid is evaporated by heat generated from the heat source to become vapor. A partition wall 20 is provided in the evaporation space 12 to control the flow of vapor. The working fluid transferred into the evaporation space 12 is uniformly mixed with the existing working fluid in the lower portion of the evaporation space 12 by a distributor 30.

9 Claims, 6 Drawing Sheets

EVAPORATION DEVICE FOR COOLING

TECHNICAL FIELD

The present disclosure relates to an evaporation Device for cooling, and more particularly, to an evaporation device for cooling using heat generated from a heat source for evaporating a working fluid.

BACKGROUND ART

Heat generated from various heat sources such as IGBT modules or thyristors used in power devices must be removed to prevent heat sources from being damaged by heat, such that the operating efficiency and durability of power devices are improved.

Related art 1 discloses an evaporator for vaporizing working fluid with heat transferred from a heat source in a loop-type heat pipe. However, since the working fluid flows through a plurality of flow paths in the evaporator disclosed in the related art 1, there is a risk of a lot of leakage, and the vapor does not flow smoothly inside the evaporator.

In addition, in the Related art 1, the working fluid is not uniformly delivered to a wick that generates the capillary action, so the movement of the working fluid by the capillary action and the evaporating action thereof are not relatively smooth.

DISCLOSURE

Technical Problem

The objective of the present disclosure is to solve the problems of the related arts as described above, such that working fluid that performs a cooling action while flowing in a heat pipe is smoothly transferred to an evaporation device.

Another objective of the present disclosure is to allow the working fluid to be evaporated by spreading over a wide area by capillary action and in the evaporation device.

Further, another objective of the present disclosure is to uniformly exchange heat with a heat source in the entire interior of the evaporation device.

Technical Solution

According to the features of the present disclosure for achieving the above objectives, the evaporation device comprises: a housing in which an evaporation space is formed, a heat source is in contact with an outer surface of one side thereof, a working fluid inlet pipe is connected on one side thereof, a vapor outlet pipe is installed on another side thereof, and the working fluid is filled to a predetermined level therein; a wick installed on the inner surface corresponding to the heat source among the inner surfaces of the evaporation space to generate movement of the working fluid by capillary action; a partition wall dividing the evaporation space into a plurality of spaces communicating with each other and supporting the wick; and a distributor installed extending to the opposite side of the working fluid inlet pipe to mix the working fluid introduced through the working fluid inlet pipe with the working fluid filled in the evaporation space.

A protection plate for protecting the wick by covering the area where the wick is installed is provided between the partition wall and the wick.

The protection plate is formed in the form of a mesh net and also causes movement of the working fluid by capillary action.

The partition wall has a communication part formed in a partition wall body part having a band shape, and a flow of vapor occurs between the spaces partitioned by the partition wall through the communication part.

The space partitioned by the partition wall is formed to become narrower toward the vapor outlet pipe.

The area of the communication part formed in the partition wall is formed to become narrower toward the vapor outlet pipe.

The working fluid inlet pipe is connected to a lower portion of one side of the housing in a gravitational direction. Meanwhile, the vapor outlet pipe is connected to an upper portion of one side of the housing in a gravitational direction.

The distributor is configured to move the working fluid by capillary action.

The distributor is formed in a hollow cylindrical shape by rolling the screen wick, or in a columnar shape with a denser inside by tightly rolling the screen wick.

A plurality of protrusions and grooves for promoting nucleate boiling of the working fluid are formed inside the housing and the inside the cover covering the evaporation space of the housing.

Advantageous Effects

An evaporation device for cooling according to the present disclosure may obtain at least one or more of the following effects.

In the present disclosure, a distributor may be installed to mix a working fluid introduced from the outside of the housing by capillary force with an existing working fluid filled at a predetermined level in the lower part of the evaporation space inside the housing. The distributor is made of, for example, a screen wick to move the working fluid by capillary force to mix with the existing working fluid in the evaporation space. Accordingly, the working fluid may be smoothly transferred to the evaporation space of the evaporation device.

In the present disclosure, the wick may be installed on the inner surface corresponding to the outer surface in contact with a heat source among the inner surfaces of the housing, such that the working fluid moving along the wick may be easily evaporated by the heat transferred from the heat source, thereby smoothly dissipating heat.

In the present disclosure, as the vapor generated by evaporation of the working fluid moves toward a vapor outlet pipe, the flow rate and flow velocity of the vapor may be adjusted to decrease relatively so that heat exchange may occur uniformly in the entire area of the wick. Therefore, there is an effect that the heat dissipation generated from the heat source may be uniformly performed as a whole.

In addition, in the present disclosure, the movement of the working fluid is based on the principle of the heat pipe, such that additional power may not be consumed to circulate the working fluid, thereby improving the efficiency of the related power device.

MODE FOR DISCLOSURE

Figure 1:
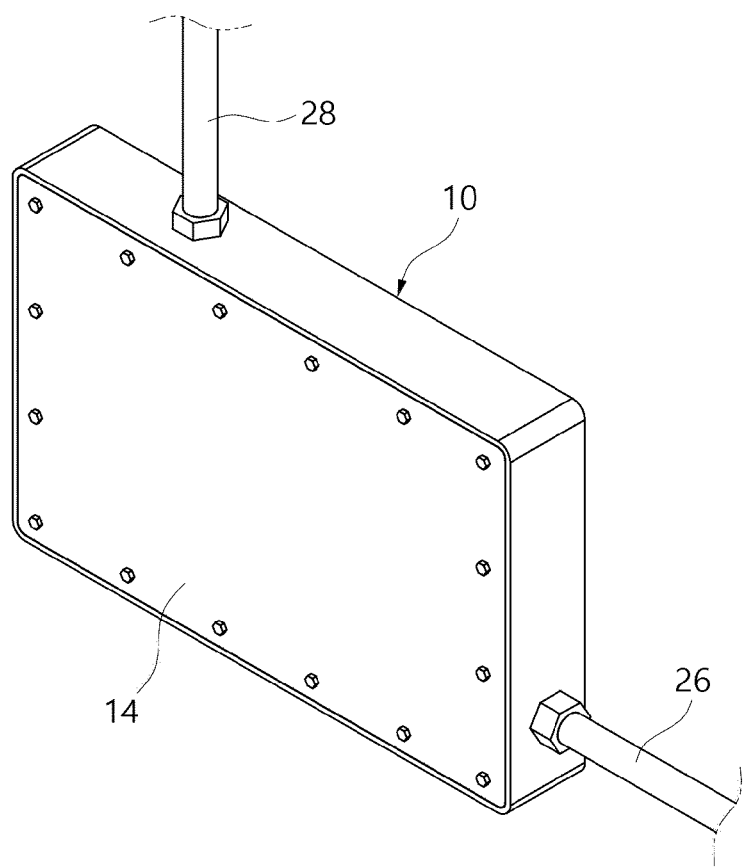
FIG. 1 is a perspective view showing an external of a preferred embodiment of an evaporation device for cooling according to the present disclosure.
Figure 2:
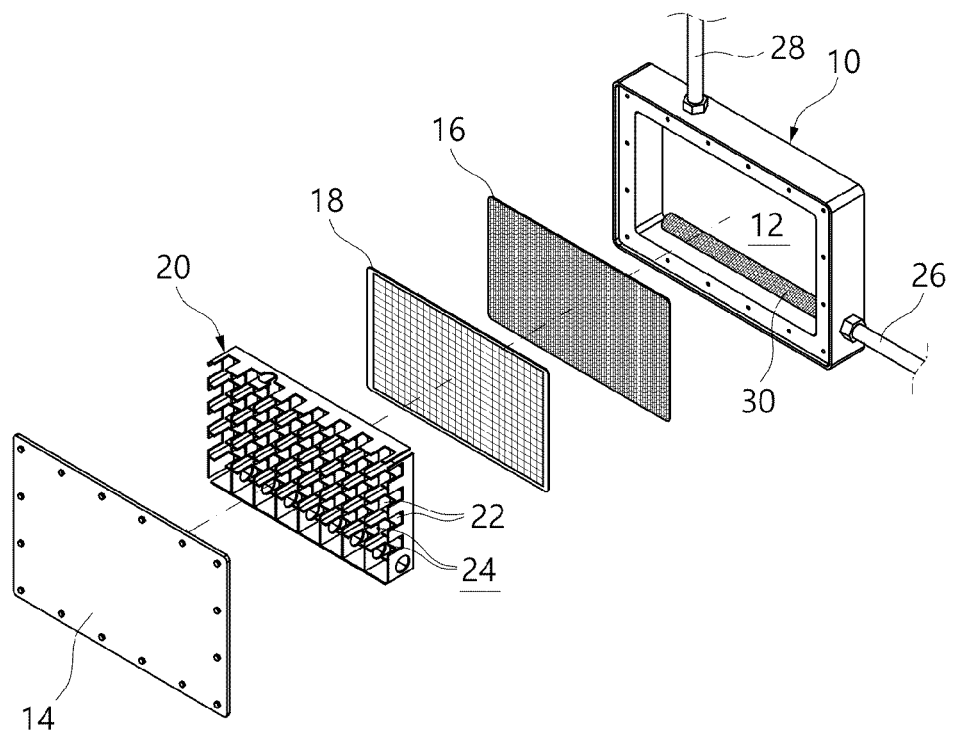
FIG. 2 is an exploded perspective view showing the configuration of the embodiment shown in FIG. 1.

Hereinafter, some embodiments of the present disclosure will be described in detail with reference to exemplary drawings. In assigning reference numerals to the components of each drawing, it should be noted that the same components are given the same reference numerals as much as possible even though the same components are indicated on different drawings. In addition, in describing the embodiment of the present disclosure, if it is determined that a detailed description of a related known configuration or function interferes with the understanding of the embodiment of the present disclosure, the detailed description thereof will be omitted.

In addition, in describing the components of the embodiment of the present disclosure, terms such as first, second, A, B, (a), (b), etc. may be used. These terms are only used to distinguish between the components, and the nature, or order of the components are not limited by the terms. When a component is described as being "combined with", "coupled to" or "connected to" another component, the component may be directly connected to or combined with each other, but it should be understood that another component may be "connected to", "coupled to" or "combined with" each of the components therebetween.

As shown in the drawings, an evaporation device for cooling of the embodiment of the present disclosure is a device in which a working fluid is evaporated by receiving heat from a heat source. The working fluid may discharge heat from a separate condensing unit to the outside, while passing through a working fluid inlet pipe 26 and a vapor outlet pipe 28 to be described below. A housing 10 may form the exterior of the evaporation device for cooling of the present disclosure. The housing 10 may have a flat hexahedral shape, and be erected so that a face having a relatively large area is viewed in a horizontal direction. An outer surface of one side of the housing 10 may be installed and used to be in contact with a heat source (not shown). A plurality of protrusions and grooves may be formed on the inside of the housing 10, that is, on an inner surface of the housing 10 to promote the working fluid nucleate boiling.

The housing 10 may include an evaporation space 12 therein. In the evaporation space 12, the working fluid may be evaporated by receiving heat from the heat source. The lower portion of the evaporation space 12 may be filled with the working fluid to a predetermined level when the evaporation device for cooling is operated. The amount of working fluid to be filled should be at least enough to submerge a distributor 30, which will be described below.

The evaporation space 12 may be shielded from the outside by a cover 14 constituting a part of the housing 10. The cover 14 may shield the evaporation space 12 from the outside while forming a surface having a relatively large area of the housing 10. The surface that the cover 14 shields may be an opposite surface facing the surface that the heat source is in contact with. A plurality of protrusions and grooves for promoting nucleate boiling of the working fluid may be formed on the inner surface of the cover 14.

A wick 16 may be installed on an inner surface of the evaporation space 12 of the housing 10. The wick 16 may serve to move the working fluid from a lower portion of the evaporation space 12 to an upper portion thereof by using the capillary force. As described above, the heat source may be in contact with the surface of the housing 10 facing the cover 14, and heat is transferred to the evaporation space 12 through the housing 10. Accordingly, the wick 16 may be entirely installed on the inner surface corresponding to the outer surface of the housing 10 in contact with the heat source. A variety of wicks 16 may be used. In the illustrated embodiment, a screen wick in the form of a mesh net may be used. The wick 16 may serve to move the working fluid by capillary action, and may move the working fluid from a lower portion of the evaporation space 12 to an upper portion thereof.

The wick 16 may be installed on an inner surface of the housing 10 such that the working fluid may move to an upper portion of the evaporation space 12 by capillary force of the wick. In such process, the working fluid may be uniformly evaporated in the entire area of the evaporation space 12 to become a gas by the heat from the heat source. To this end, the wick 16 may be positioned on the entire inner surface of the housing 10 with the largest area.

When a screen wick is used as the wick 16, a protection plate 18 may be installed to protect and fix the wick 16 at the same time. The protection plate 18 may maintain the shape of the wick 16 without being damaged by a partition wall 20 (described below), and allow the wick 16 to be fixedly installed. The protection plate 18 may have the same structure as the wick 16, but have a less tight mesh structure than the mesh structure of the wick 16. Accordingly, the protection plate 18 may protect the first wick 16, and at the same time may also partially serve to move the working fluid to the upper portion of the evaporation space by capillary force.

For reference, various types of wicks may be used as the wick 16. A screen wick is used as an example in this embodiment. However, a sintered metal wick may be used or a groove wick formed on the inner surface of the housing 10 may be used.

A partition wall 20 may be installed in the evaporation space 12. The partition wall 20 may divide the evaporation space 12 into a plurality of spaces communicating with each other. The partition wall 20 may also serve to press the protection plate 18 to fix the protection plate 18 in the evaporation space 12. The partition wall 20 may be installed to be press-fitted into the housing 10 and may press the protection plate 18 to be fixed. Of course, the partition wall 20 may be fastened to the housing 10 using a fastening means.

Figure 4:
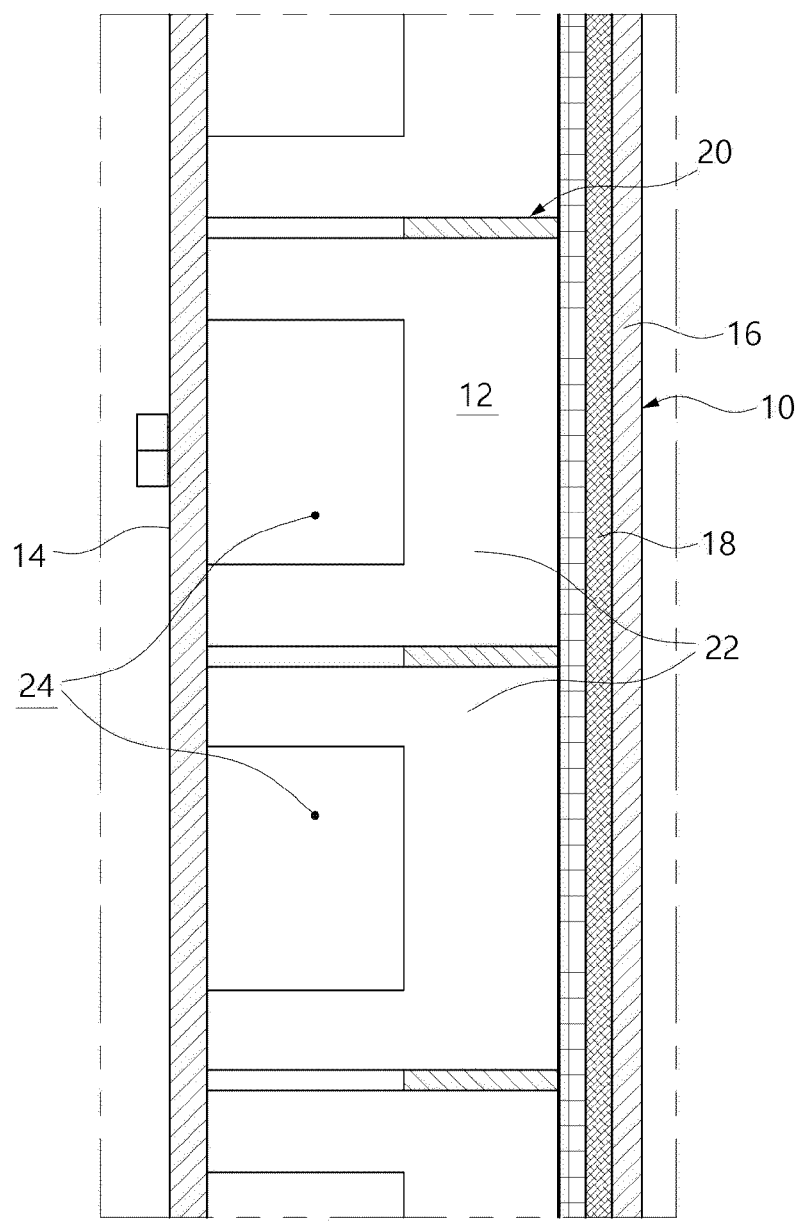
FIG. 4 is a cross-sectional view showing the internal configuration of the embodiment of the present disclosure.
Figure 5:
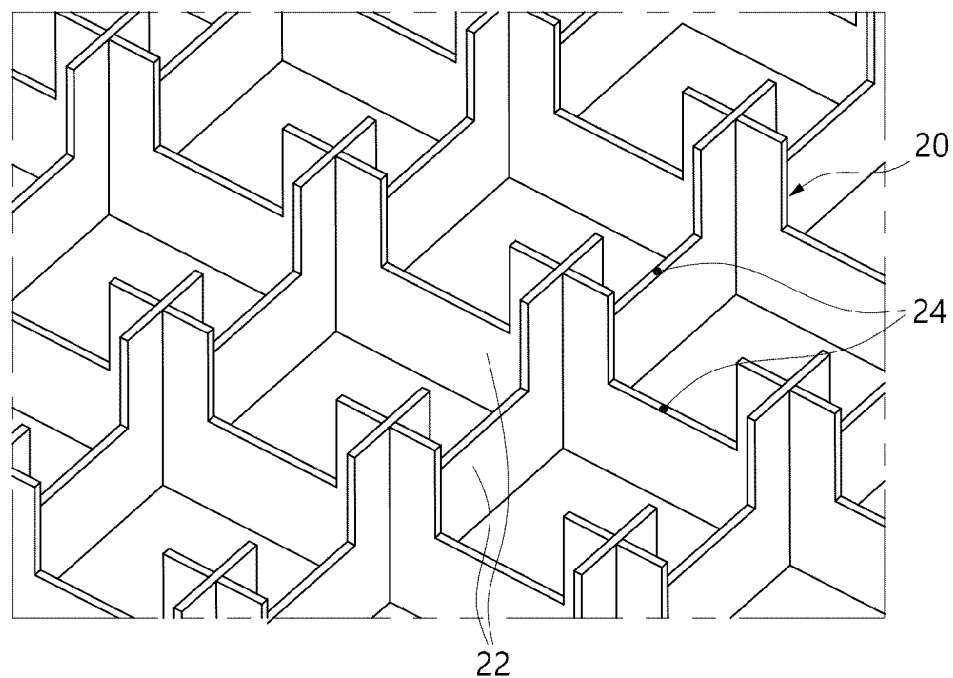
FIG. 5 is a perspective view showing a partition wall constituting the embodiment of the present disclosure.
Figure 6:
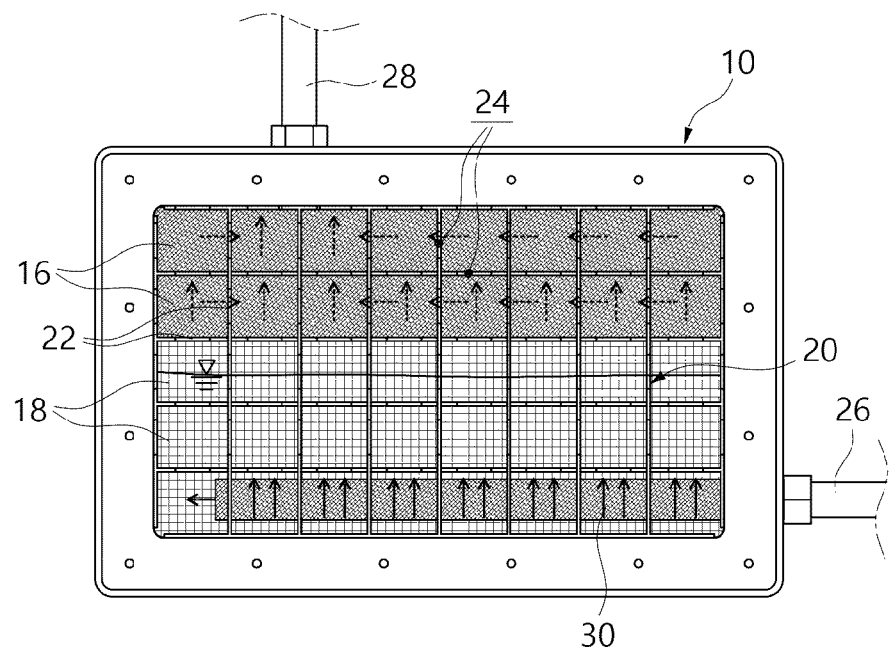
FIG. 6 is an operation state diagram showing a working fluid and vapor flow in the embodiment of the present disclosure based on FIG. 3.
Figure 7:
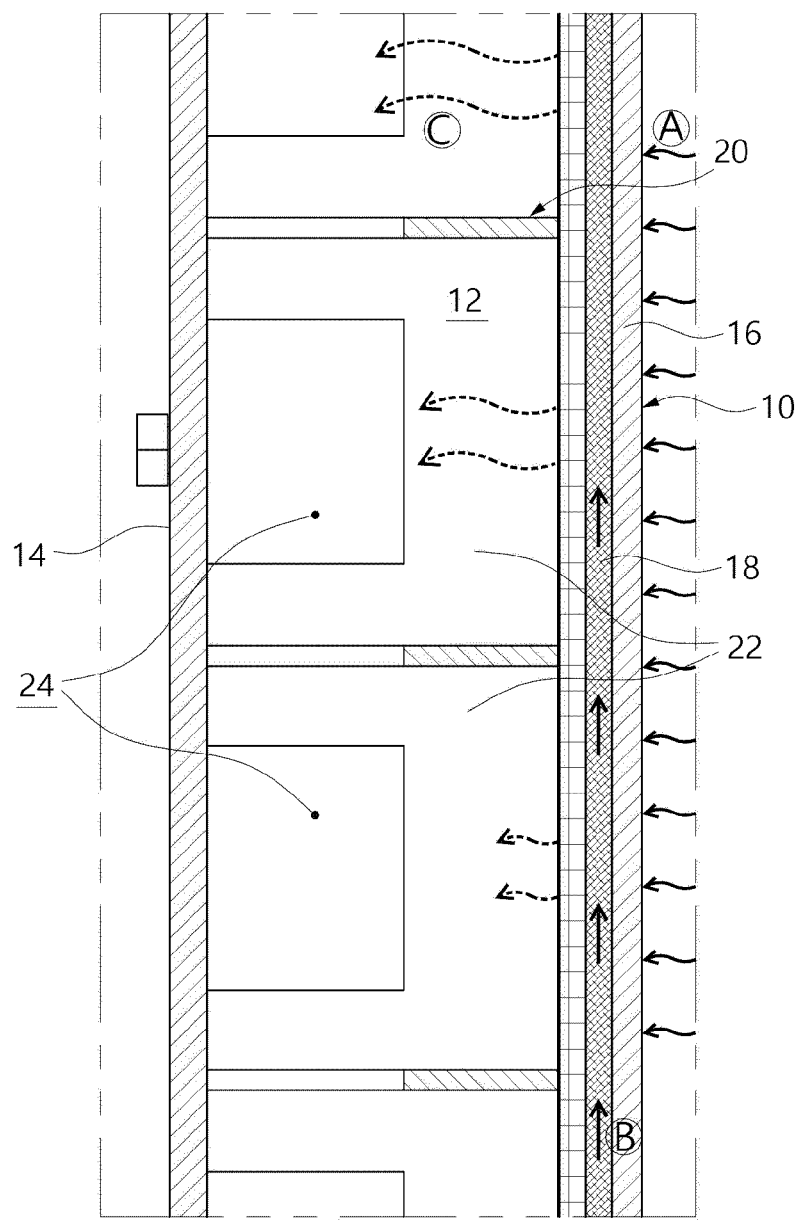
FIG. 7 is an operation state diagram showing that the working fluid and vapor flow in the embodiment of the present disclosure based on FIG. 4.

In the partition wall 20, a partition wall body part 22 having a band-shaped plate shape may form an exterior of the partition wall 20, and a plurality of communication parts 24 may be formed in the partition wall body part 22 to allow spaces partitioned by the partition wall 20 to communicate with each other. The partition wall body part 22 may be orthogonally coupled to each other by coupling slots (reference numerals not assigned) formed at positions corresponding to each other and positioned in the evaporation space 12 in a grid shape. As shown in FIG. 4, the front end of the partition wall 20 may be in close contact with the cover 14. In this way, the partition wall 20 may be fixed in the housing 10 without an additional fastening means.

Figure 3:
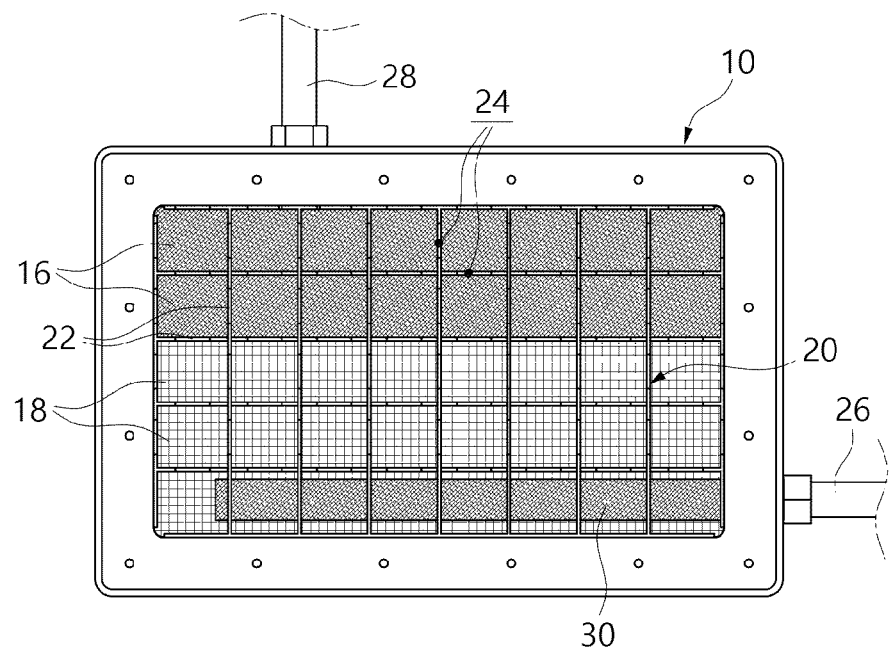
FIG. 3 is a front view showing the internal configuration with an upper half of a protection plate removed in the embodiment of the present disclosure.

The communication part 24 formed in the partition wall 20 may allow spaces partitioned by the partition wall 20 to communicate with each other. The amount of vapor flowing between the partitioned spaces may be determined according to the area of the communication part 24. In other words, the area of the communication part 24 may vary the speed and amount of vapor flowing, so that the degree of dissipating the heat generated from the heat source by the working fluid may be varied. In general, the flow of vapor becomes faster in a region close to the vapor outlet pipe 28. Therefore, heat may be well dissipated in the region adjacent to the vapor outlet pipe 28, but in the region adjacent to the working fluid inlet pipe 26, the flow of vapor is inevitably slow, so the heat dissipation amount may be relatively small. In this case, when viewed over the entire area of the evaporation space 12, heat dissipation may occur non-uniformly. Referring to FIG. 3, the amount of heat dissipation from the upper-right region of the evaporation space 12 may be small, and the amount of heat dissipation from the upper-left region of the evaporation space 12 may be large.

Accordingly, it is preferable that the area of the communication part 24 may be relatively small in the region adjacent to the vapor outlet pipe 28, and the area of the communication part 24 may be relatively large in the region adjacent to the working fluid inlet pipe 26.

Such a structure may ensure uniformity of heat dissipation by controlling the speed and amount of vapor flow, which may be performed in other ways. That is, even if an area of the communication part 24 is the same, the size of the spaces divided by the partition wall 20 may be relatively narrow in the region adjacent to the vapor outlet pipe 28, and relatively wide in the region adjacent to the working fluid inlet pipe 26. In such a way, the speed and amount of vapor flow may be controlled. To this end, the size of the space partitioned by the partition wall 20 may be adjusted depending on the location, or while the horizontal and vertical intervals of the partition walls 20 are the same as in the illustrated embodiment, an additional partition wall 20 may be installed between the partition walls 20, thereby controlling the flow speed and amount of vapor.

Meanwhile, the working fluid inlet pipe 26 for supplying the working fluid to the evaporation space 12 of the housing 10 from the outside may be provided. The working fluid inlet pipe 26 may be installed on a lower portion of the housing 10 in the gravitational direction, passing through the housing 10, as shown in FIGS. 1 and 3. The working fluid inlet pipe 26 may communicate with a lower portion of the evaporation space 12.

To discharge the vapor produced in the evaporation space 12 of the housing 10 to the outside, the vapor outlet pipe 28 may be connected to an upper portion of the housing 10 in the gravitational direction. That is, compared to the working fluid inlet pipe 26, the vapor outlet pipe 28 may be relatively higher in the gravitational direction. The vapor outlet pipe 28 may communicate with the upper portion of the evaporation space 12.

The distributor 30 may be installed in a lower portion of the evaporation space 12 connected to the working fluid inlet pipe 26. The distributor 30 may serve to uniformly transfer the working fluid introduced through the working fluid inlet pipe 26 to the entire lower portion of the evaporation space 12. The working fluid introduced through the working fluid inlet pipe 26 may have a lower temperature than the existing working fluid in the evaporation space 12. Accordingly, the working fluid introduced through the working fluid inlet pipe 26 may be uniformly mixed with the existing working fluid filled in the lower portion of the evaporation space 12 and may be transferred to the evaporation space 12 through the wick 16, so that the working fluid may uniformly receive the heat from the heat source throughout the evaporation space 12.

The distributor 30 may be, for example, a hollow cylindrical shape by rolling the screen wick, or a columnar shape with a denser inside by tightly rolling the screen wick. That is, when the distributor 30 is formed in a hollow cylindrical shape, the working fluid introduced through the working fluid inlet pipe 26 may be moved through the inside of the cylindrical screen wick, and at the same time, may be quickly transferred to the front end of the distributor 30 through the capillary action generated from the screen wick. When the screen wick is tightly rolled to form a columnar shape, the working fluid may flow through the inside of the distributor 30 and move by the capillary action occurring in the screen wick.

Hereinafter, the use of the evaporation device for cooling according to the present disclosure having the above-described configuration will be described in detail.

When the evaporation device for cooling of the present disclosure is used, the working fluid may be pre-filled to the extent that the distributor 30 is submerged in the inside of the evaporation space 12.

Heat may be transferred from the heat source in contact with the rear surface of the housing 10 as indicated by arrow A. In addition, the working fluid filled in the evaporation space 12 may move to the upper portion of the evaporation space 12 by the wick 16 as indicated by arrow B.

When the working fluid moves along the wick 16 by capillary force and absorbs heat transferred from the heat source, the working fluid may become a gas and move to the spaces partitioned by the partition walls 20, as indicated by arrow C. In the evaporation space 12, the vapor may flow toward the vapor outlet pipe 28.

As the vapor flows toward the vapor outlet pipe 28, the flow speed and flow amount may be controlled by the partition wall 20, etc. The flow speed and flow amount may be relatively reduced toward the vapor outlet pipe 28, while the flow speed and flow amount may be relatively increased toward the working fluid inlet pipe 26, so that the (generated) heat may be transferred to the working fluid as uniformly as possible and dissipated efficiently.

Meanwhile, the working fluid transferred from a condensing unit (not shown) through the working fluid inlet pipe 26 may be distributed in the working fluid in the lower portion of the evaporation space 12 by the distributor 30. The distributor 30 may generate the capillary action so that the working fluid may move from the working fluid inlet pipe 26 to the front end of the distributor 30 to be mixed with the existing working fluid pre-filled in the evaporation space 12. Accordingly, the working fluid having a relatively low temperature may be uniformly mixed with the existing working fluid having a relatively high temperature in the evaporation space 12, and thus the working fluid may receive the heat transferred from the heat source uniformly as a whole.

The vapor generated in the evaporation space 12 may flow through the vapor outlet pipe 28 and may be transferred to the condensing unit. In the condensing unit, for example, the vapor may be heat-exchanged with the external air to be made into a liquid working fluid again. The working fluid formed in a liquid state may be supplied into the evaporation space 12 through the working fluid inlet pipe 26 again, and heat generated from the heat source may be dissipated through the process described above.

Even though it has been described that all components constituting the embodiments of the present disclosure are combined into one or operated in combination with each other, the present disclosure is not necessarily limited to the embodiments. That is, within the scope of the objective of the present disclosure, all of the components may be selectively combined into at least one and operated. In addition, the terms such as "include", "consist of", or "have" described above mean that the corresponding component may be present unless otherwise stated, and thus should be construed that the terms do not exclude other components, but may further include other components. All terms, including technical or scientific terms, have the same meaning as commonly understood by those skilled in the art to which the present disclosure belongs, unless defined otherwise. Generally used terms, such as terms defined in the dictionary, should be interpreted as being consistent with the contextual meaning of the related art, and should not be interpreted in an ideal or excessively formal meaning unless explicitly defined in the present disclosure.

The above description is merely illustrative of the technical idea of the present disclosure, and those skilled in the art to which the present disclosure belongs may perform various modification and changes within the scope not departing from the essential characteristics of the present disclosure. Accordingly, the embodiments disclosed in the present disclosure are not intended to limit, but to explain the technical idea of the present disclosure, and the scope of the technical spirit of the present disclosure is not limited by these embodiments. The scope of protection of the present disclosure should be interpreted by the claims below, and all technical spirits within the scope equivalent to the scope of the claims should be interpreted as being included in the scope of the claims of the present disclosure.

For example, the protection plate 18 may not be used if the wick 16 may not be damaged by the partition wall 20.

The invention claimed is:

1. An evaporation device for cooling, comprising:
   a housing having inner surfaces forming an evaporation space, and having an outer surface contacting with a heat source, the housing being connected to a working fluid inlet pipe on one side and a vapor outlet pipe on another side thereof, and configured to fill a working fluid with a level therein;
   a wick installed on an inner surface corresponding to the heat source among the inner surfaces to generate movement of the working fluid by capillary action;
   a partition wall dividing the evaporation space into a plurality of spaces communicating with each other and supporting the wick; and
   a distributor installed extending to an opposite side of the working fluid inlet pipe to mix the working fluid introduced through the working fluid inlet pipe with the working fluid pre-filled in the evaporation space,
   wherein the partition wall includes a partition wall body part having a band shape and a communication part formed in the partition wall body part, and the vapor flows between the plurality of spaces partitioned by the partition wall through the communication part.

2. The evaporation device for cooling of claim 1, wherein a protection plate is installed between the partition wall and the wick and covers an area where the wick is installed.

3. The evaporation device for cooling of claim 2, wherein the protection plate is formed of a mesh net to cause the movement of the working fluid by the capillary action.

4. The evaporation device for cooling of claim 1, wherein the plurality of spaces partitioned by the partition wall are formed to become narrower toward the vapor outlet pipe.

5. The evaporation device for cooling of claim 1, wherein an area of the communication part formed in the partition wall is formed to become narrower toward the vapor outlet pipe.

6. The evaporation device for cooling of claim 1, wherein the working fluid inlet pipe is connected to a lower portion of the housing in a gravitational direction, and the vapor outlet pipe is connected to an upper portion of the housing in the gravitational direction.

7. The evaporation device for cooling of claim 1, wherein the distributor is configured to move the working fluid by the capillary action.

8. The evaporation device for cooling of claim 7, wherein the distributor is formed in a hollow cylindrical shape by rolling a screen wick, or in a columnar shape with a denser inside by tightly rolling the screen wick.

9. The evaporation device for cooling of claim 1, further comprising a cover configured to cover the evaporation space to promote nucleate boiling of the working fluid, wherein a plurality of protrusions and grooves are formed inside the housing and the cover.

* * * * *